(12) United States Patent
White et al.

(10) Patent No.: US 11,882,371 B2
(45) Date of Patent: Jan. 23, 2024

(54) LENSLESS 3-DIMENSIONAL IMAGING USING DIRECTIONAL SENSING ELEMENTS

(71) Applicant: California Institute of Technology, Pasadena, CA (US)

(72) Inventors: Alexander D. White, Carlsbad, CA (US); Parham Porsandeh Khial, Alhambra, CA (US); Seyed Ali Hajimiri, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 16/102,484

(22) Filed: Aug. 13, 2018

(65) Prior Publication Data
US 2019/0075282 A1 Mar. 7, 2019

Related U.S. Application Data

(60) Provisional application No. 62/544,476, filed on Aug. 11, 2017.

(51) Int. Cl.
*H04N 13/20* (2018.01)
*H01L 25/16* (2006.01)
(Continued)

(52) U.S. Cl.
CPC ........... *H04N 25/41* (2023.01); *H01L 25/167* (2013.01); *H04N 5/30* (2013.01); *H04N 13/20* (2018.05); *H05K 1/189* (2013.01); *H04N 13/388* (2018.05)

(58) Field of Classification Search
CPC ........ G02B 27/22; G02B 30/00; H04N 13/20; H04N 5/30; H04N 5/3415; H04N 13/388; H01L 25/167; H05K 1/189
See application file for complete search history.

(56) References Cited

U.S. PATENT DOCUMENTS

| 4,585,948 A | 4/1986 | Schneider et al. |
| 4,915,463 A | 4/1990 | Barbee, Jr. |

(Continued)

FOREIGN PATENT DOCUMENTS

| CN | 1949833 A | 4/2007 |
| CN | 101027598 A | 8/2007 |

(Continued)

OTHER PUBLICATIONS

WIPO Application No. PCT/US2018/046529, PCT International Search Report and Written Opinion of the International Searching Authority dated Dec. 4, 2018.

(Continued)

*Primary Examiner* — Michael Le
(74) *Attorney, Agent, or Firm* — Weaver Austin Villeneuve & Sampson LLP

(57) ABSTRACT

A lens-less 3-D imaging device includes, in part, a multitude of optical receiving elements positioned along a concave or flat surface defining a focal zone of the imaging device. Each optical receiving element has a field of view that overlaps with a field of view of a number of other optical receiving elements. The optical receiving elements may optionally be grating couplers or photo detectors. The optical receiving elements may be disposed on a circuit board. The circuit board may be flexible and include control circuitry configured to form the image in accordance with the received responses of the optical receiving elements and further in accordance with the optical transfer functions of the of optical receiving elements. The circuit boards may include one or more flex sensors or strain gauges adapted to determine their curvatures.

29 Claims, 9 Drawing Sheets

(51) Int. Cl.
  *H04N 5/30* (2006.01)
  *H05K 1/18* (2006.01)
  *H04N 25/40* (2023.01)
  *H04N 13/388* (2018.01)

(56) References Cited

U.S. PATENT DOCUMENTS

| | | | |
|---|---|---|---|
| 5,196,900 | A | 3/1993 | Pettersen |
| 6,483,096 | B1 | 11/2002 | Kunz et al. |
| 6,587,180 | B2 | 7/2003 | Wang et al. |
| 7,211,820 | B2 | 5/2007 | Gunapala et al. |
| 8,660,312 | B2 * | 2/2014 | Cui .................. G02B 21/18 382/106 |
| 8,710,427 | B2 | 4/2014 | Amako et al. |
| 9,110,240 | B2 | 8/2015 | Gill et al. |
| 9,377,179 | B2 * | 6/2016 | Tukker .................. F21K 9/64 |
| 9,484,386 | B2 | 11/2016 | Chang |
| 9,837,455 | B2 | 12/2017 | Lin et al. |
| 10,094,661 | B2 | 10/2018 | Hsu et al. |
| 11,326,946 | B2 | 5/2022 | Brueck et al. |
| 2002/0185535 | A1 | 12/2002 | Tsikos et al. |
| 2003/0038933 | A1 | 2/2003 | Shirley et al. |
| 2003/0103037 | A1 | 6/2003 | Rotzoll |
| 2005/0243439 | A1 | 11/2005 | Tomita et al. |
| 2007/0083289 | A1 * | 4/2007 | Russell .............. G05B 19/4207 901/1 |
| 2011/0157393 | A1 | 6/2011 | Zomet et al. |
| 2011/0228142 | A1 | 9/2011 | Brueckner et al. |
| 2012/0013749 | A1 | 1/2012 | Oberdoerster et al. |
| 2012/0091372 | A1 | 4/2012 | Molnar et al. |
| 2012/0286147 | A1 * | 11/2012 | Hvass .................. G01S 3/781 250/200 |
| 2013/0085398 | A1 | 4/2013 | Roukes |
| 2013/0135515 | A1 | 5/2013 | Abolfadl et al. |
| 2014/0043320 | A1 | 2/2014 | Tosaya et al. |
| 2014/0085265 | A1 | 3/2014 | Yin |
| 2014/0209581 | A1 * | 7/2014 | Pawlowski .......... B23K 26/03 219/121.69 |
| 2015/0077618 | A1 | 3/2015 | Ueno et al. |
| 2015/0125943 | A1 * | 5/2015 | Molnar .................. G01B 11/14 356/614 |
| 2015/0193937 | A1 | 7/2015 | Georgiev et al. |
| 2015/0236066 | A1 | 8/2015 | Tayanaka |
| 2016/0069997 | A1 * | 3/2016 | Johnson .............. H04N 5/2254 356/614 |
| 2016/0127713 | A1 | 5/2016 | Hazeghi |
| 2016/0161731 | A1 | 6/2016 | Brueck et al. |
| 2016/0295087 | A1 | 10/2016 | Oberdörster |
| 2017/0112376 | A1 | 4/2017 | Gill et al. |
| 2017/0187933 | A1 | 6/2017 | Duparre |
| 2017/0243373 | A1 | 8/2017 | Bevensee et al. |
| 2017/0261738 | A1 | 9/2017 | Shiono |
| 2018/0191953 | A1 | 7/2018 | Stork et al. |
| 2018/0275350 | A1 | 9/2018 | Oh et al. |
| 2018/0321390 | A1 * | 11/2018 | Gotthold .................. G01T 1/115 |
| 2018/0329185 | A1 | 11/2018 | Gill et al. |
| 2019/0028623 | A1 * | 1/2019 | Hajimiri .............. H04N 5/2259 |
| 2019/0094575 | A1 * | 3/2019 | Wang .................... G02F 1/1326 |
| 2019/0209102 | A1 | 7/2019 | Hugg |
| 2019/0278006 | A1 | 9/2019 | Tajima et al. |
| 2020/0124474 | A1 | 4/2020 | Brueck et al. |

FOREIGN PATENT DOCUMENTS

| | | | |
|---|---|---|---|
| CN | 101455071 | A | 6/2009 |
| CN | 101622716 | A | 1/2010 |
| CN | 102265124 | A | 11/2011 |
| CN | 102710902 | A | 10/2012 |
| CN | 103837937 | A | 6/2014 |
| CN | 104375270 | A | 2/2015 |
| CN | 104395818 | A | 3/2015 |
| CN | 104518835 | A | 4/2015 |
| WO | WO-2012044250 | A1 * | 4/2012 .............. G02B 5/008 |
| WO | WO-2016199984 | A1 | 12/2016 |
| WO | WO-2017095587 | A1 | 6/2017 |

OTHER PUBLICATIONS

WIPO Application No. PCT/US2018/043326, PCT International Search Report and Written Opinion of the International Searching Authority dated Sep. 28, 2018.
WIPO Application No. PCT/US2018/043326, PCT International Preliminary Report on Patentability dated Jan. 30, 2020.
WIPO Application No. PCT/US2018/046529, PCT International Preliminary Report on Patentability dated Feb. 20, 2020.
U.S. Appl. No. 16/043,039, Requirement for Restriction/Election dated Nov. 13, 2019.
U.S. Appl. No. 16/043,039, Non-Final Office Action dated Jun. 8, 2020.
CN Office Action dated Jun. 20, 2022, in Application No. CN201880058687 with English translation.
U.S. Non-Final office Action dated Sep. 15, 2022 in U.S. Appl. No. 16/043,039.
U.S. Office Action dated Feb. 9, 2022 in U.S. Appl. No. 16/043,039.
U.S. Office Action dated Jan. 19, 2021 in U.S. Appl. No. 16/043,039.
U.S. Office Action dated Jul. 30, 2021 in U.S. Appl. No. 16/043,039.
CN Office Action dated Feb. 8, 2023, in Application No. CN201880058687 with English translation.
U.S. Final Office Action dated May 17, 2023 in U.S. Appl. No. 16/043,039.
U.S. Notice of Allowance dated Sep. 22, 2023, in U.S. Appl. No. 16/043,039.

* cited by examiner

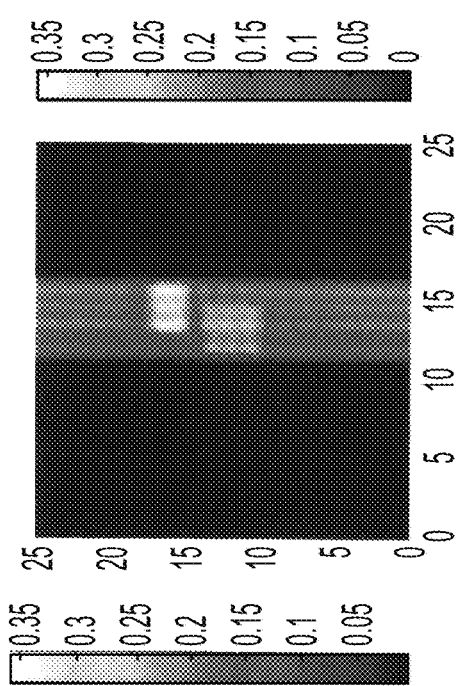
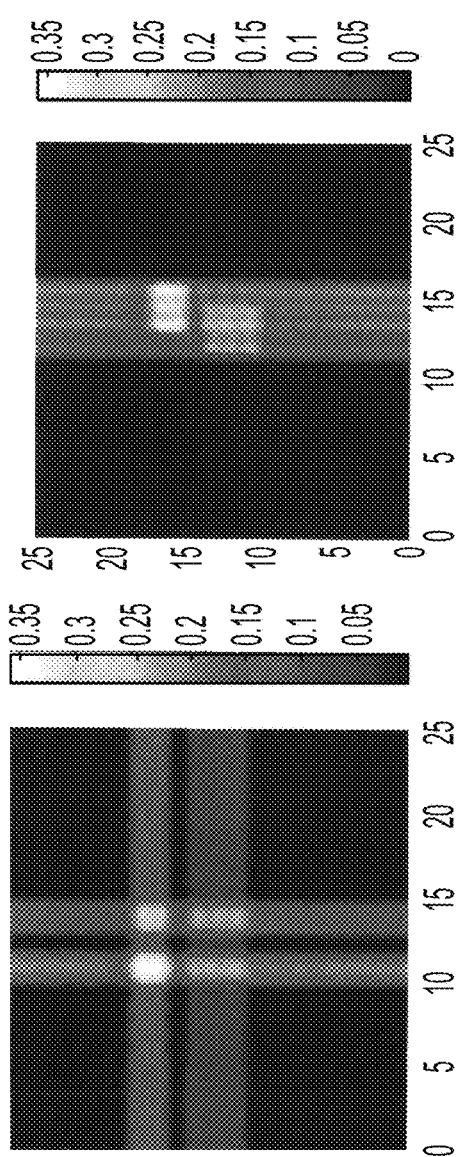
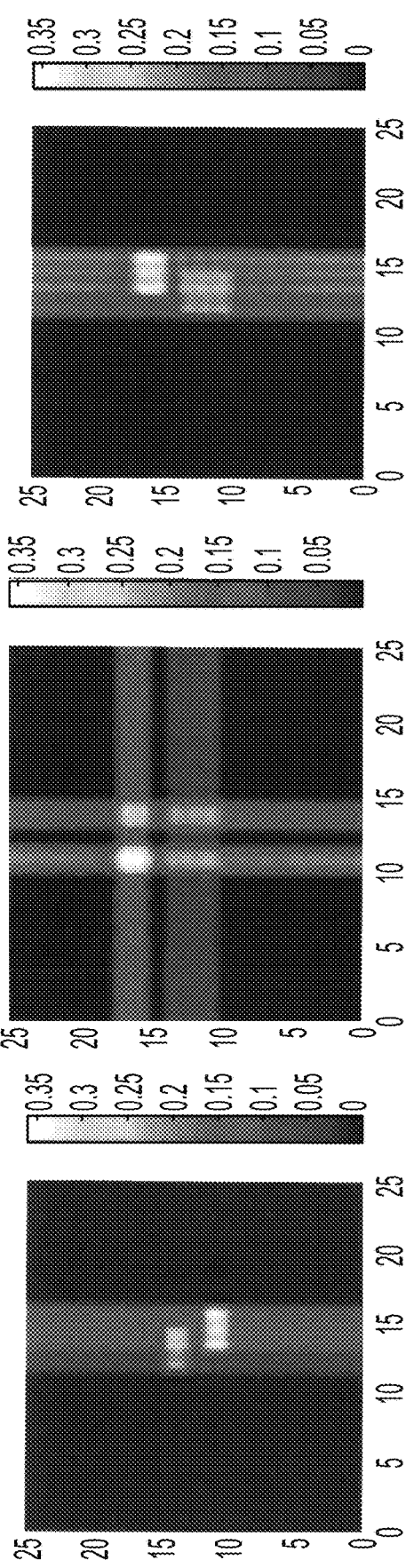
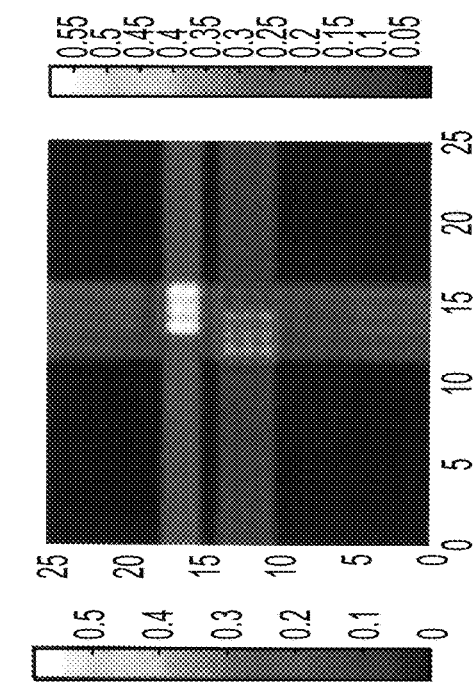
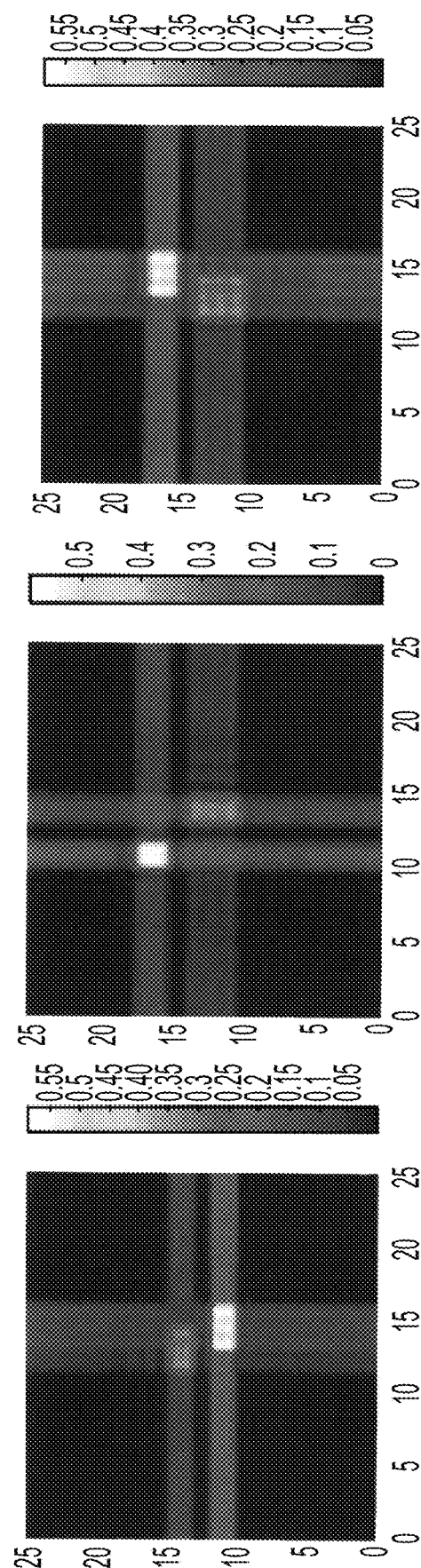
Figure 10A  Figure 10B  Figure 10C
Figure 11A  Figure 11B  Figure 11C

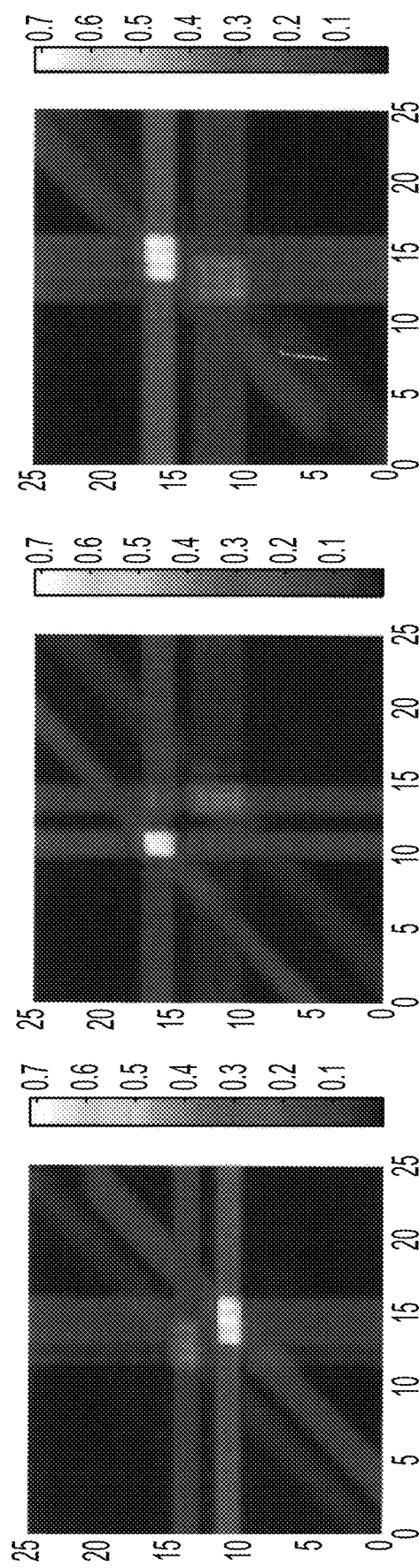

LENSLESS 3-DIMENSIONAL IMAGING USING DIRECTIONAL SENSING ELEMENTS

CROSS REFERENCE TO RELATED APPLICATIONS

The present application claims benefit under 35 USC 119(e) of Application Ser. No. 62/544,476, filed Aug. 11, 2017, the content of which is incorporated herein by reference in its entirety.

The present application is related to U.S. application Ser. No. 16/043,039, filed Jul. 23, 2018, the content of which is incorporated herein by reference in its entirety.

FIELD OF THE INVENTION

The present invention relates to imaging devices, and more particularly to a lens-less imaging device.

BACKGROUND OF THE INVENTION

Conventional optical imaging systems use a lens to form an image of a target object on a sensor array. An optical phased array receiver may be used as a coherent imaging device by using a beam-forming technique. Incoherent imaging techniques based on signal correlation have also been used in astronomy.

BRIEF SUMMARY OF THE INVENTION

A lens-less 3-D imaging device, in accordance with one embodiment of the present invention, includes, in part, a multitude of optical receiving elements positioned along a flat or concave surface defining a focal zone in which a 3-D image of a target is formed. Each optical receiving element has a field of view that overlaps with a field of view of at least a subset of the other optical receiving elements.

In one embodiment, each optical receiving element is a transparent dielectric optical receiving element. In one embodiment, each optical receiving element is a grating coupler. In one embodiment, each optical receiving element is a photo detector. In one embodiment, each optical receiving element has one or more walls having a different angle relative to a reference angle. In one embodiment, at least a first subset of the optical receiving elements has a Gaussian distribution response. In one embodiment, at least a first subset of optical receiving elements has a non-Gaussian distribution response.

In one embodiment, each of the grating couplers has the same angular view. In one embodiment, each of the photo detectors has the same angular view. In one embodiment, the optical receiving elements are positioned along inner surfaces of an icosahedron. In one embodiment each of at least a subset of the inner surfaces of the icosahedron includes a circuit board on which at least a subset of the optical receiving elements are disposed.

In one embodiment, at least one of the circuit boards includes control circuitry configured to form the 3-D image in accordance with the received responses of the optical receiving elements and further in accordance with the optical transfer functions of the of optical receiving elements. In one embodiment, at least one of the circuit boards is a flexible circuit board. In one embodiment, at least one of the circuit boards includes one or more flex sensors adapted to determine a curvature of the flexible circuit board. In one embodiment, at least one of the circuit boards includes one or more strain gauges adapted to determine a curvature of the flexible circuit board.

A lens-less 3-D imaging device, in accordance with one embodiment of the present invention, includes, in part, a first multitude of optical receiving elements positioned along a first inner surface of a cube or a cuboid, a second multitude of optical receiving elements positioned along a second inner surface of the cube or the cuboid, and a third multitude of optical receiving elements positioned along a third inner surface of the cube or the cuboid. Each of the second and third inner surface having an edge in common with the first inner surface. In one embodiment, each of the first, second and third multitude of optical receiving elements are disposed in two-dimensional arrays.

A method of forming a 3-D image of a target, in accordance with one embodiment of the present invention, includes, in part, receiving a response from each of a multitude of optical receiving elements positioned along a flat or a concave surface, and forming the 3-D image in accordance with the received responses and further in accordance with optical transfer functions of the optical receiving elements. Each optical receiving element has a field of view that overlaps with a field of view of at least a subset of the other optical receiving elements.

In one embodiment, each optical receiving element is a transparent dielectric optical receiving element. In one embodiment, each optical receiving element is a grating coupler. In one embodiment, each optical receiving element is a photo detector. In one embodiment, each optical receiving element has one or more walls having a different angle relative to a reference angle. In one embodiment, at least a first subset of the optical receiving elements has a Gaussian distribution response. In one embodiment, at least a first subset of optical receiving elements has a non-Gaussian distribution response.

In one embodiment, each of the grating couplers has the same angular view. In one embodiment, each of the photo detectors has the same angular view. In one embodiment, the optical receiving elements are positioned along inner surfaces of an icosahedron. In one embodiment each of at least a subset of the inner surfaces of the icosahedron includes a circuit board on which at least a subset of the optical receiving elements are disposed.

In one embodiment, at least one of the circuit boards includes control circuitry configured to form the 3-D image in accordance with the received responses of the optical receiving elements and further in accordance with the optical transfer functions of the of optical receiving elements. In one embodiment, at least one of the circuit boards is a flexible circuit board. In one embodiment, at least one of the circuit boards includes one or more flex sensors adapted to determine a curvature of the flexible circuit board. In one embodiment, at least one of the circuit boards includes one or more strain gauges adapted to determine a curvature of the flexible circuit board.

A method of forming a 3-D imaging of a target, in accordance with one embodiment of the present invention, includes, in part, receiving a response from each of a first multitude of optical receiving elements positioned along a first inner surface of a cube or a cuboid, receiving a response from each of a second multitude of optical receiving elements positioned along a second inner surface of the cube or the cuboid, said second inner surface having an edge in common with the first inner surface, receiving a response from each of a third multitude of optical receiving elements positioned along a third inner surface of the cube or the cuboid, and forming the 3-D image in accordance with the received responses and further in accordance with the optical transfer functions of the first, second and third multitude of optical receiving elements. The first surface shares a common edge with the second and third surfaces. The second surface shares a common edge with the first and third surfaces. In one embodiment, each of the first, second and third multitude of optical receiving elements is disposed in a two-dimensional array.

BRIEF DESCRIPTION OF THE DRAWINGS

FIGS. 10A, 10B and 10C are computer simulation images of the targets shown in FIGS. 8A, 8B and 8C, respectively, and formed using a 2×20×20 array of directional receiving elements, in accordance with another embodiment of the present invention.

FIGS. 11A, 11B and 11C are computer simulation images of the targets shown in FIGS. 8A, 8B and 8C, respectively, and formed using a 3×20×20 array of directional receiving elements, in accordance with another embodiment of the present invention.

FIGS. 12A, 12B and 12C are computer simulation images of the targets shown in FIGS. 8A, 8B and 8C, respectively, and formed using a 4×20×20 array of directional receiving elements, in accordance with another embodiment of the present invention.

DETAILED DESCRIPTION OF THE INVENTION

A lens-less imaging device, in accordance with one embodiment of the present invention, includes a directionally sensitive receiver array formed by a multitude of receiver elements that have different responses to different directions from which light from a target is received. The receiver elements are positioned along flat or curved surfaces, or straight or curved paths so as to form a volumetric focal zone (referred to hereinafter as focal zone) so as to enable the lens-less imaging device to form a 3-D image of an object positioned in the focal zone.

Because a 3-D imaging device, in accordance with embodiments of the present invention, includes sensors that are sensitive to the direction along which they receive, light, the 3-D imaging device, enables the use of an incoherent and/or stationary illumination sources. For example, illumination may occur from a fixed source assembled on or otherwise integrated in the same substrate in which the pixels are integrated. Furthermore, the ability to image incoherent light enables the capture and formation of imaging of a fluorescent substance with gap between excitation and emission spectra.

Figure 1:
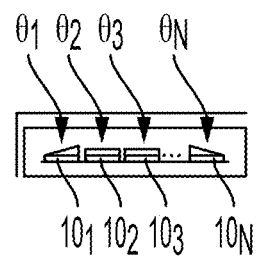
FIG. 1 is a simplified high-level side view of a lens-less imaging device, in accordance with one embodiment of the present invention.

FIG. 1 is a simplified high-level side view of a lens-less imaging device 100, in accordance with one embodiment of the present invention. Imaging device 100 is shown as including N directionally sensitive optical receivers (alternatively referred to herein as pixels or detectors) $10_1$, $10_2$, $10_3$ ... $10_N$ that are shown as being respectively sensitive to light received from directions $\theta_1$, $\theta_2$ ... $\theta_N$. Imaging device 100 operates as described below.

In an incoherent/coherent imaging system, the phasor amplitudes received from different points on a target are uncorrelated since the illumination is spatially incoherent. Equation (1) below shows the relationship between the light intensity of an image of a target and the light intensity emanating from target along the x-direction for a one-dimensional array of pixels:

$$I_{IM}(f_x) = |H(f_x)|^2 I_{TAR}(f_x) = H(f_x) I_{TAR}(f_x) \qquad (1)$$

In equation (1), $I_{IM}(f_x)$ represents the image light intensity shown as being a function of the Fourier transform of the received light intensity along the x-direction, $H(f_x)$ is the optical transfer function providing a mapping between the target and its image, $|H(f_x)|^2$ represents that square of the absolute value of $H(f_x)$, and $I_{TAR}(f_x)$ represents the target light intensity shown as being a function of the Fourier transform of the light intensity emanating from the target along the x-direction.

In a two-dimensional space, the optical transfer function may be represented by the following expression:

$$H(f_x, f_y) = \frac{FT\{h^2(u, v)\}}{\iint_\infty^{-\infty} |h(u, v)|^2 \, du dv} \quad (2)$$

In equation (2), h(u, v) represents the point-spread function associated with the imaging system, FT represents the Fourier transform operation, and (u, v) are variables representing positions along the x-y axis.

Using Parseval's identity, it is seen that:

$$H(f_x, f_y) = \frac{\iint_{-\infty}^{\infty} H\left(p + \frac{f_x}{2}, q + \frac{f_y}{2}\right) H^*\left(p - \frac{f_x}{2}, q - \frac{f_y}{2}\right) dp dq}{\iint_\infty^{-\infty} |H(p, q)|^2 \, dp dq} \quad (3)$$

In equation (3), p and q are variables used in the integration. Accordingly, the optical transfer function $H(f_x, f_y)$ is the normalized autocorrelation function of the amplitude transfer function (ATF). Geometrically, the optical transfer function is the overlap area of the ATF with a spatially shifted version of the ATF divided by the total area of the ATF.

In accordance with one embodiments of the present invention, because each pixel 10 is sensitive to the light received from a different direction, each pixel captures the incident light differently. The intensity of the light arriving at the angle θ near the center of pixel $10_i$, namely $I_{im_i}(\theta)$, may be defined as shown below:

$$I_{im_i}(\theta) = H_i(\theta) * I_{tar}(\theta) = \int H_i(\theta) I_{tar}(\theta) d\theta \quad (4)$$

In equation (4), $H_i(\theta)$ represents the optical transfer function of pixel $10_i$, $I_{tar}(\theta)$ represents the intensity of the light received from the target, and * denotes the convolution operation.

Since the imaging device has N pixels, the intensity of the light received by the N pixels may be represented by vector $\vec{I}_{im}(\theta)$ defined as shown below:

$$\vec{I}_{im}(\theta) = \vec{H}_i(\theta) * \vec{I}_{tar}(\theta) \quad (5)$$

In Equation (5), each entry in vector $\vec{I}_{im}(\theta)$ represents the average light intensity received along the direction θ, $\vec{H}(\theta)$ represents the vector of transfer functions, and $\vec{I}_{tar}(\theta)$ represents the average light intensity emanating from the target along the direction θ.

Each vector in equation (5) may be represented by a matrix. Assuming M represents the discretization of the values in equation (5), vector $\vec{I}_{im}$ may be represented by a 1×N matrix Y, vector $\vec{H}(\theta)$ may be represented by an N×M matrix H, and vector $\vec{I}_{tar}$ may be represented by an 1×M matrix I:

$$I = \begin{pmatrix} I_1 \\ \vdots \\ I_M \end{pmatrix}$$

$$H = \begin{pmatrix} H_{11} & \cdots & H_{1M} \\ \vdots & \ddots & \vdots \\ H_{N1} & \cdots & H_{NM} \end{pmatrix}$$

$$Y = \begin{pmatrix} Y_1 \\ \vdots \\ Y_N \end{pmatrix}$$

Accordingly, equation (5) may be shown in a matrix form as:

$$Y = H \cdot I \quad (6)$$

Referring to equation (6) because the matrix Y is obtained by the imaging device, in accordance with the present invention, and the transfer functions of the pixels represented by matrix H is also known, as described further below, the image of the target represented by matrix I can be computed.

Figure 2A:
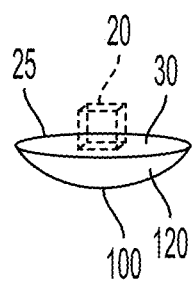
FIG. 2A shows a portion of a spherical surface on which a multitude of pixels may be disposed to form a 3-D imaging device, in accordance with one embodiment of the present invention.

FIG. 2A shows a portion of a spherical surface on which a multitude of pixels may be disposed to form a 3-D imaging device 100, in accordance with one embodiment of the present invention. Imaging device 100 is shown as having a focal zone 20 which may be, for example, a cube or a cuboid.

Figure 2B:
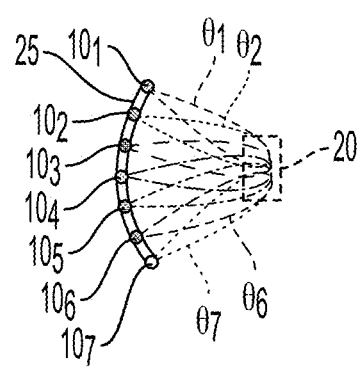
FIG. 2B is a side view of the imaging device shown in FIG. 2A, in accordance with one embodiment of the present invention.

FIG. 2B is a side view of device 100 shown as having, for example, 7 pixels $10_1, 10_2 \ldots 10_7$ positioned uniformly along a portion of perimeter 25 of circular plane 30. Each pixel $10_i$, where i is an index ranging from 1 to 7 in this exemplary embodiment and view of the imaging device, is shown as being responsive to light arriving at an angle $\theta_i$. For example, pixel $10_i$ is shown as being responsive to light arriving at angle $\theta_1$, pixel $10_2$ is shown as being responsive to light arriving at angle $\theta_2$, and pixel $10_N$ is shown as being responsive to light arriving at angle $\theta_N$. Such angular/directional sensitivity/responsiveness is also referred to herein as angular view.

Figure 2C:
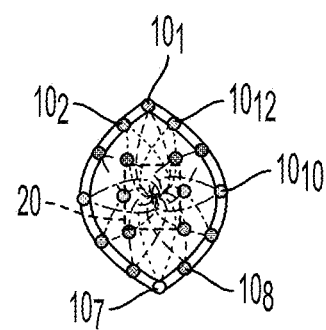
FIG. 2C is a top view of the imaging device shown in FIG. 2A, in accordance with one embodiment of the present invention.

FIG. 2C is a top view of imaging device 100 showing pixels $10_1, 10_2 \ldots 10_{12}$ positioned uniformly along perimeter 25 of circular plane 30. Also shown in FIG. 2C are top view of focal zone 20, as well as angular views of the pixels. Although imaging device 100 is shown as having pixels that are positioned uniformly along perimeter 25 of plane 30, it is understood that in other embodiments, the pixels may not be so uniformly spaced. Furthermore, although imaging device 100 is shown as having 12 pixels, it is understood that in other embodiments, imaging device 100 may have any number of pixels. It is further understood that the pixels may be placed along any position on the surface 120 of imaging device 100. Moreover, in other embodiments, surface 120 may not be spherical, and may have a cylindrical or other regular/irregular geometric shapes.

Figure 3A:
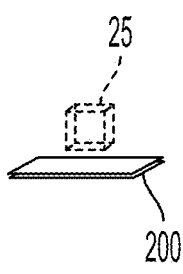
FIG. 3A shows a portion of a planar surface on which a multitude of pixels may be disposed to form a 3-D imaging device, in accordance with another embodiment of the present invention.

FIG. 3A shows a portion of a planar surface on which a multitude of pixels may be disposed to form a 3-D imaging device 200, in accordance with another embodiment of the present invention. Imaging device 100 is shown as having a focal zone 25 which may be a cube or a cuboid.

Figure 3B:
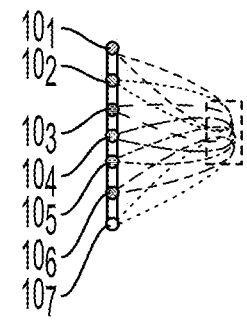
FIG. 3B is a side view of the imaging device shown in FIG. 3A, in accordance with one embodiment of the present invention.

FIG. 3B is a side view of device 200 shown as having, for example, 7 pixels $10_1, 10_2 \ldots 10_7$ positioned uniformly along an edge of rectangular plane 200. Each pixel $10_i$, where i is an index ranging from 1 to 7 in this exemplary embodiment and view of the imaging device, is shown as being responsive to light arriving at angle $\theta_i$. For example, pixel $10_i$ is shown as being responsive to light arriving at angle $\theta_1$, pixel $10_2$ is shown as being responsive to light arriving at angle $\theta_2$, and pixel $10_N$ is shown as being responsive to light arriving at angle $\theta_N$.

Figure 3C:
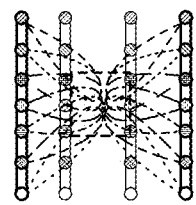
FIG. 3C is a top view of the imaging device shown in FIG. 3A, in accordance with one embodiment of the present invention.

FIG. 3C is a top view of imaging device 200 showing pixels $10_1$, $10_2$ ... $10_{14}$ positioned uniformly along the two opposing edges of rectangular plane 30. Also shown in FIG. 3C are top view of focal zone 20 and angular views of the pixels. Although imaging device 200 is shown as having pixels that are positioned uniformly along the two opposing edges of rectangular plane 30, it is understood that in other embodiments, the pixels may not be so uniformly spaced. Furthermore, although imaging device 200 is shown as having 14 pixels, it is understood that in other embodiments, imaging device 100 may have any number of pixels. It is further understood that the pixels may be placed along any other position on the surface of rectangular plane 30. Moreover, in other embodiments, plane 200 may not be rectangular, and may have, for example, square, circular, elliptical or other regular/irregular geometric shapes.

Figure 4:
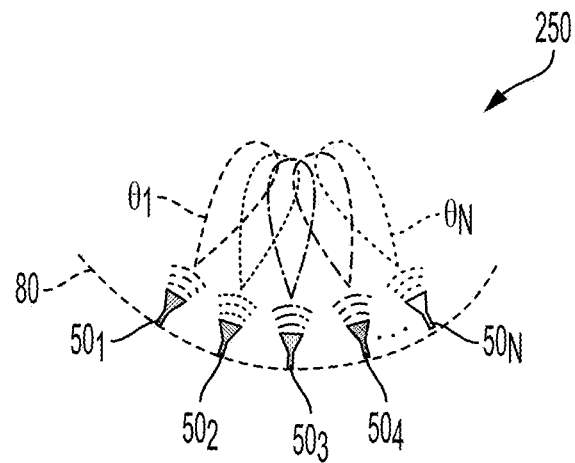
FIG. 4 is a schematic top view of a lens-less 3-D imaging device, in accordance with one embodiment of the present invention.

FIG. 4 is a schematic side view of a lens-less 3-D imaging device 250, in accordance with one embodiment of the present invention. Imaging device 250 is shown as including N grating couplers $50_1$, $50_2$ ... $50_N$ positioned along curved path 80. In the embodiment shown in FIG. 4, each grating coupler is adapted to have the same angular view and response characteristic to the light received from a target whose 3-D image is being formed by the imaging device. However, because each grating coupler is positioned along a different point on curved path 80, each grating coupler is responsive to the light received from a different direction. As shown, for example, in FIG. 4, grating coupler $50_1$ is shown as being responsive to light arriving at angle $\theta_1$, grating coupler $50_2$ is shown as being responsive to light arriving at angle $\theta_2$, and grating coupler $50_N$ is shown as being responsive to light arriving at angle $\theta_N$. In one embodiment, by changing, for example, the spacing(s) between the openings of a grating coupler or its index, the sensitivity and responsiveness of the grating coupler to the angle of the incident light may be varied.

In one embodiment, curved path 80 may be a circular path. In another embodiment, curved path 80 may be an elliptical path. In yet other embodiments, curved path 80 may be an irregular curved path. Although the grating couplers $50_i$ of the embodiment 250 are shown as having the same angular view, in other embodiments, two or more of the grating couplers may have different angular views. Although not shown, in yet other embodiments, an array of plasmonic antennas may be used to form a 3-D imaging device, in accordance with embodiments of the present invention.

Figure 5:
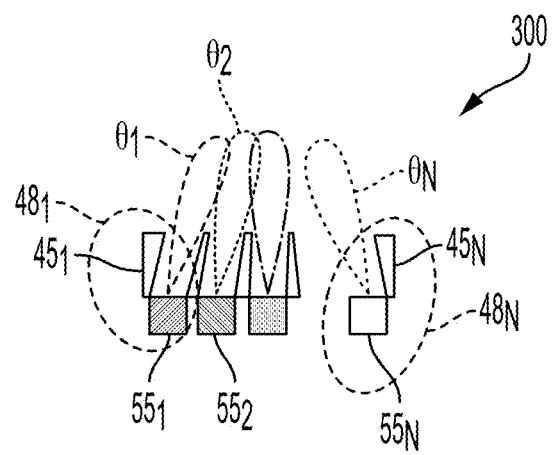
FIG. 5 is a schematic top view of a lens-less 3-D imaging device, in accordance with one embodiment of the present invention.

FIG. 5 is a simplified high-level side view of a lens-less 3-D imaging device 300, in accordance with another embodiment of the present invention. Imaging device 300 is shown as including N pixels $48_i$, each of which is shown as including a wall $45_i$ facing its associated light detector/sensor $55_i$, where i is an index ranging from 1 to N. As seen from FIG. 5, the angle between each detector and its associated wall facing the detector defines the angular view of the pixel. For example, the angle between detector $55_1$ and wall $45_1$ defines the angular view $\theta_1$ of pixel $48_1$. Likewise, the angle between detector $55_N$ and wall $45_N$ defines the angular view $\theta_N$ of pixel $48_N$. Although not shown in FIG. 5, it is understood that the field of view of each pixel in the array overlaps with the fields of view of multitude of other pixels in the array. Furthermore, although detectors $55_i$ are shown as being positioned along a straight path, it is understood that in other embodiments, detectors $55_1$ may positioned along a curved path, such as circular, elliptical or any other regular or irregular curved paths.

Figure 6:
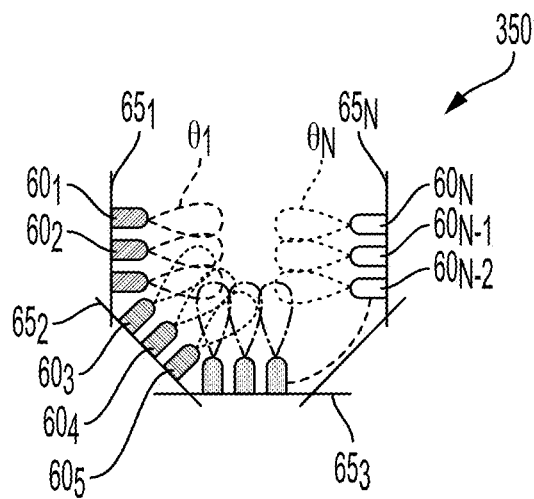
FIG. 6 is a schematic top view of a lens-less 3-D imaging device, in accordance with one embodiment of the present invention.

FIG. 6 is a simplified high-level side view of a lens-less 3-D imaging device 350, in accordance with another embodiment of the present invention. Imaging device 350 is shown as including N photo detectors $60_i$, where i is an index ranging from 1 to N. Each photo detector is shown as having the same angular view. However, because different sets of the photo detectors are positioned in different directions, imaging device has a focal zone (not shown in FIG. 6) that enables the formation of the 3-D image. Embodiment 350 of the 3-D imaging device is shown as having sets of 3 photo detectors with each set positioned along a different direction. For example, photo detectors $60_1$, $60_2$ and $60_3$ are shown as positioned along line (which may be a straight or a curved line) $65_1$; photo detectors $60_4$, $60_5$ and $60_6$ are shown as positioned along line (which may be a straight or a curved) $65_2$; and photo detectors $60_{N-2}$, $60_{N-1}$ and $60_N$ are shown as positioned along line $65_N$ which may be a straight or a curved line) $65_2$. It is understood that in other embodiments, one or more of the photo detectors may have different angular views.

A lens-less 3D imaging device, in accordance with embodiments of the present invention, provides a number of advantages. For example, a lens-less 3D imaging device, in accordance with embodiments of the present invention, may project a coherent light onto a fluorescent target sample and thereby form an image at the wavelength radiated from the sample. The light radiated from the sample is non-coherent and thus allows for a non-coherent image reconstruction, as described above.

A lens-less 3D imaging device formed using grating couplers, such as that shown in FIG. 4, may be used to form a 3-D image of a target while sweeping the frequency of the light. Taking multiple samples during a wavelength sweep increases the number of directions from which the light is captured thereby increasing the accuracy of the image reconstruction. As is known, the angular sensitivity of a grating coupler is dependent on the wavelength of the light. Therefore, using a tunable narrow bandwidth incoherent light source in a lens-less 3D imaging device formed using grating couplers, enables the capture of the intensity information from more angles. Moreover, using an incoherent phased array or other dynamic systems as directional sensing elements with different angular views, in accordance with any of the embodiments described herein, enables the element to raster over a multitude of directions. This increases the directionality and provides for a larger imaging volume or higher resolution image.

In accordance with some embodiments of the present invention, an array of pixels or directionally sensitive receiving elements may be tileable to form larger arrays. For example, each sensor or a sensor array may have a hexagonal or square shape that can be joined or tiled with other similar sensors or sensor arrays to form a relatively larger surface of sensing elements adapted capture 3D images. Such sensor or sensor arrays may be fully integrated with a controller or a processing unit (such as a central processing unit (CPU)) adapted to capture analog data, digitize the captured analog data and communicate the digitized data in a distributed or centralized network to perform the computations and processing, as described above, to form the image. The sensor arrays may be powered either internally or externally and may transfer both power and the data to other sensor arrays disposed in the 3-D imaging system. The data may then be transmitted using radio frequency inductive lines, by wires, or wirelessly. Furthermore, a distributed or centralized processing system may be implemented to reconstruct the image using the processing power of the sensing elements.

In accordance with some embodiments of the present invention, an array of pixels or directionally sensitive receiving elements may be disposed on a flexible board/substrate, such as flexible printed circuit board (PCB). The flexible board may be bent to provide a curved surface so as to provide a multitude of receiving elements with otherwise the same angular views, different angular or directional sensitivity. Such flexible array may also be used to form a distributed conformal imaging device, such as on clothing fabric, e.g., a shirt. For example, referring to FIGS. 2A, 2B and 2C, spherical or semi-spherical surface 120 may be formed using a flexible board. Although each of the of pixels $10_i$ positioned on surface 120 is shown as having the same angular view $\theta_i$, because of the curved surface of surface 120, each pixel is responsive to light received from a different direction. The flexible board may be designed to have a known curvature. In other embodiments, such as in conformal imaging devices, the curvature of the flexible board may be computed using a multitude of flex sensors or strain gauges built into the flexible board.

Image processing techniques may also be used to compute the curvature of the flexible board. To achieve this, in one embodiment, the curvature is determined by taking one or more images of a known scene/target and varying the curvature until the difference between the target and its image falls below a threshold value. In accordance with another embodiment, a machine or statistical learning algorithm may be used to determine the positions of the receiving elements based on the expectations of how the images should look like in reality.

In yet other embodiments, an array of sensing elements may be formed on a semiconductor substrate that has a CMOS chip integrated therein. The chip may perform all necessary processing and computations to form the 3-D image and can communicate directly with other systems.

Figure 7A:
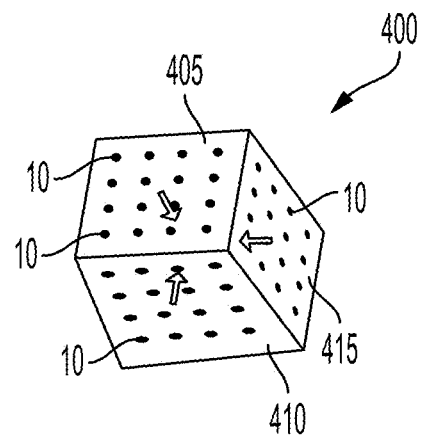
FIGS. 7A, 7B and 7C are schematic views of a lens-less 3D imaging device 400, in accordance with another embodiment of the present invention.
Figure 7B:
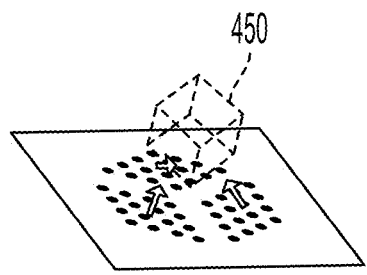
Figure 7C:
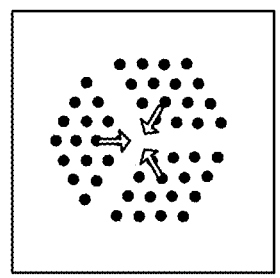

FIG. 7A shows a lens-less 3D imaging device 400, in accordance with another embodiment of the present invention. Imaging device 400 is shown as having 48 pixels 10 disposed on adjacent interior surfaces of a cube. Each of the interior surfaces 405, 410, 415 are shown as having a 4×4 array of pixels 10. Each pixel 10 may be a grating coupler as shown in FIG. 4, a sensor with an associated wall as shown in FIG. 5, a photo detector as shown in FIG. 5, or any directionally sensitive optical receiver such as that shown, for example, in FIG. 1. Imaging device 400 has a focal zone defined by the three arrows shown in FIG. 7A. FIG. 7B is a perspective view of imaging device 400 when the three interior surfaces are expanded to form a one-dimensional plane. Also shown in FIG. 7B is the focal zone 450 of imaging device 400. FIG. 7C is a top view of imaging device 400 when the three interior surfaces are expanded to form a one-dimensional plane.

Figures 8A, 8B, 8C:
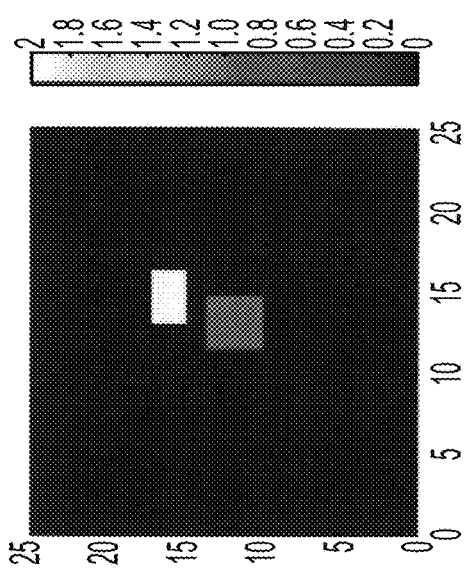
FIGS. 8A, 8B and 8C are three targets being imaged by a lens-less 3D imaging device, in accordance with embodiments of the present invention.
Figures 9A, 9B, 9C:
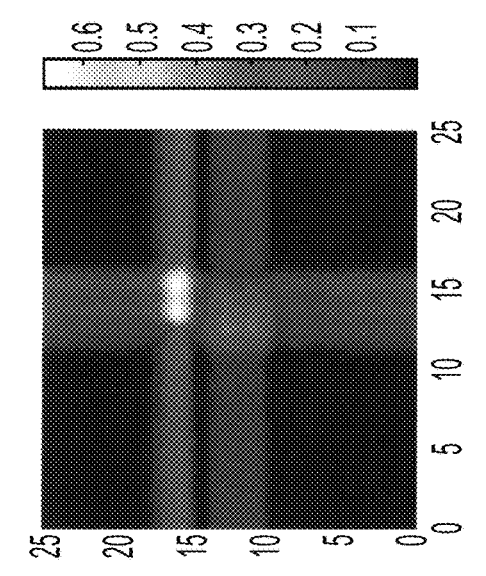
FIGS. 9A, 9B and 9C are computer simulation images of the targets shown in FIGS. 8A, 8B and 8C, respectively, and formed using a 3×10×10 array of directional receiving elements, in accordance with another embodiment of the present invention.

FIGS. 8A, 8B and 8C are three targets being imaged. FIGS. 9A, 9B and 9C respectively are images of the targets shown in FIGS. 8A, 8B and 8C formed using a 3×10×10 array of directional receiving elements each having a Gaussian distribution pattern with a sigma of 1, in accordance with one embodiment of the present invention. FIGS. 10A, 10B and 10C respectively are images of the targets shown in FIGS. 8A, 8B and 8C formed using a 2×20×20 array of directional receiving elements each having a Gaussian distribution pattern with a sigma of 1, in accordance with one embodiment of the present invention. FIGS. 11A, 11B and 11C respectively are images of the targets shown in FIGS. 8A, 8B and 8C formed using a 3×20×20 array of directional receiving elements each having a Gaussian distribution pattern with a sigma of 1, in accordance with one embodiment of the present invention. FIGS. 12A, 12B and 12C respectively are images of the targets shown in FIGS. 8A, 8B and 8C formed using a 4×20×20 array of directional receiving elements each having a Gaussian distribution pattern with a sigma of 1, in accordance with one embodiment of the present invention. It is seen from these Figures that as the number of directional receiving elements increases, the image quality improves.

Figure 13:
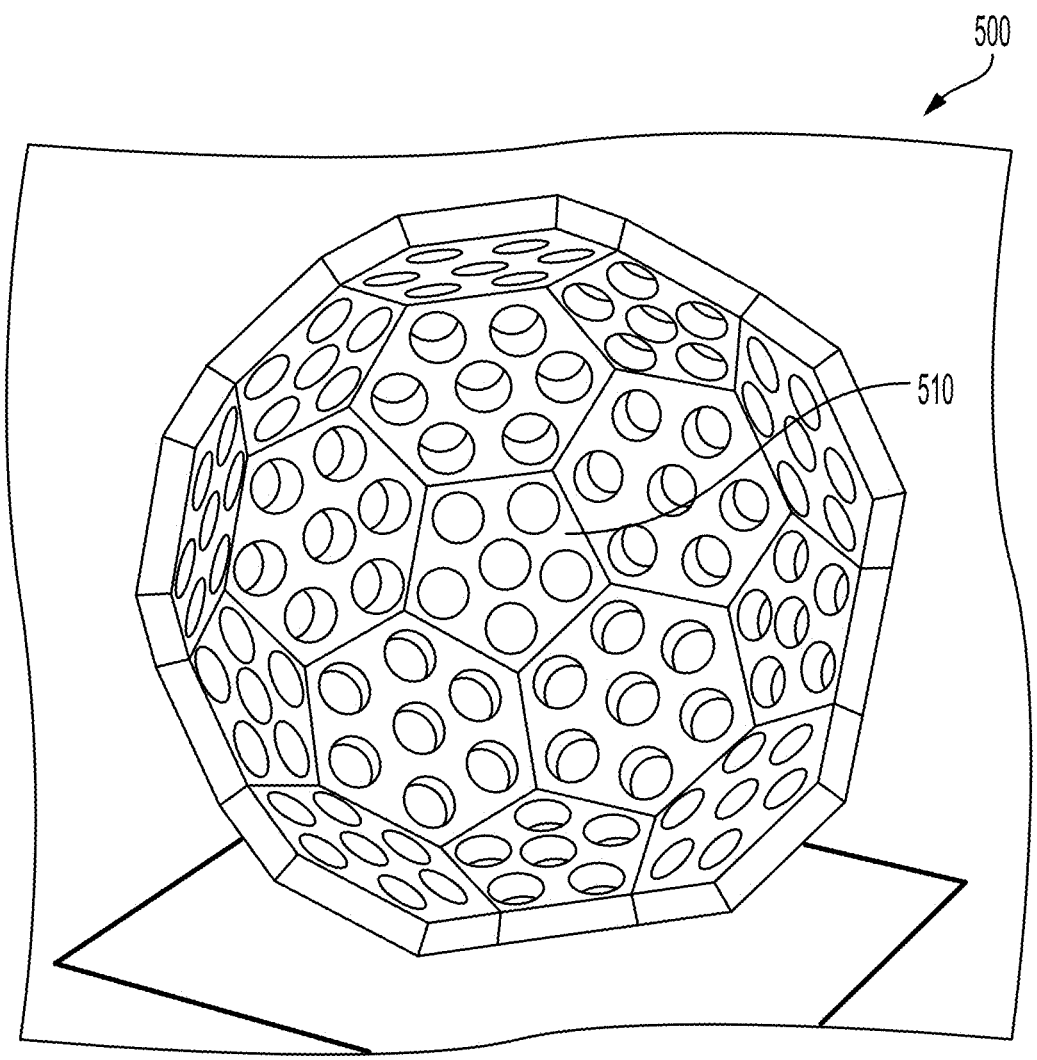
FIG. 13 shows a 3-D imaging device with directional receiving elements positioned within interior surfaces of half of a truncated icosahedron, in accordance with one embodiment of the present invention.

FIG. 13 shows a half of a truncated icosahedron adapted to include a multitude of directional receiving elements to form a 3D imaging device 500, in accordance with one embodiment of the present invention. Surface 510 seen as being positioned farthest away is a pentagon having 5 holes. Each of the other surfaces having an edge in common with surface 500 is a hexagon having 6 holes. Each hole in each surface is adapted to receive one or more directionally sensitive receiving elements, such as a photodiode.

Figure 14:
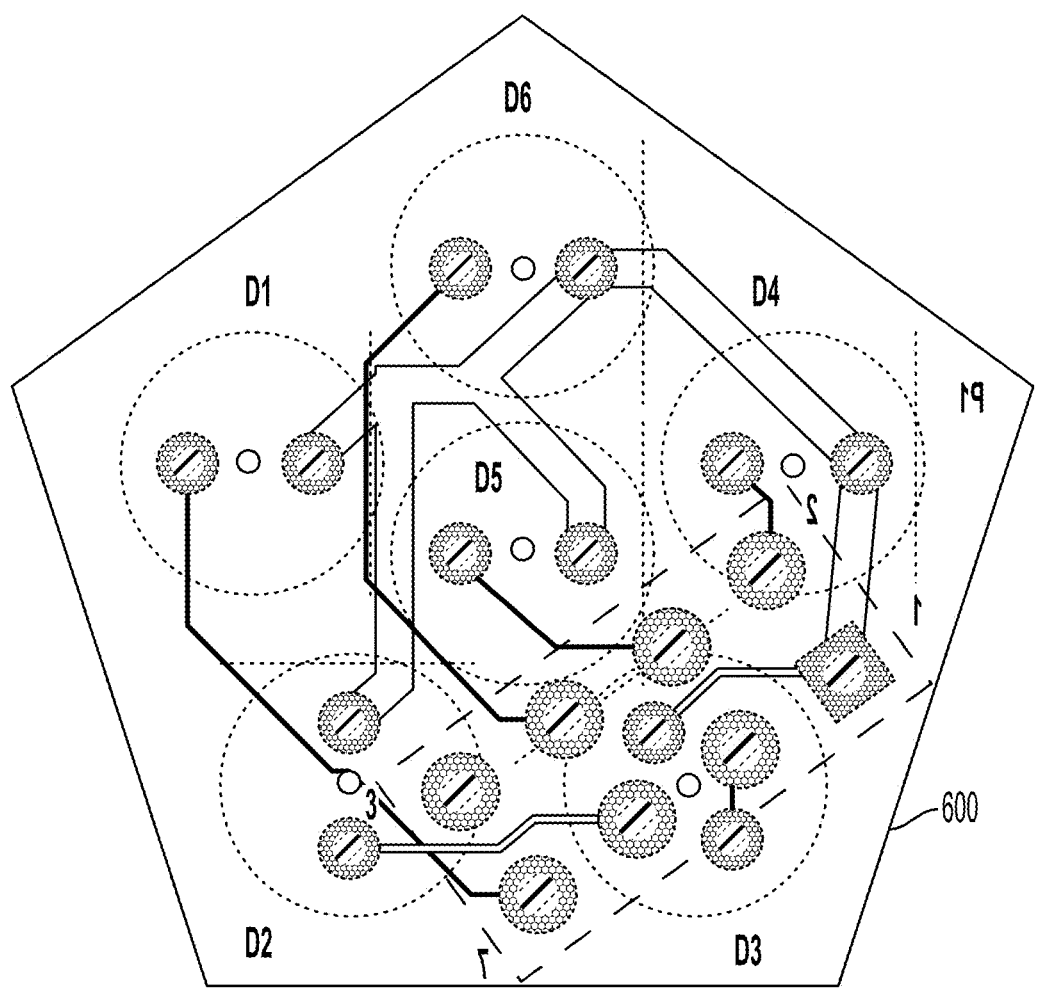
FIG. 14 shows a printed circuit board that includes, in part, a multitude of directional receiving elements and adapted to form the pentagonal surface of the icosahedron shown in FIG. 14, in accordance with one embodiment of the present invention.

In yet other embodiments, each of the pentagonal or hexagonal surfaces may be a printed circuit board (PCB) that includes respectively 5 or 6 directionally sensitive receiving elements, such as a photodiode. For example, PCB 600 shown in FIG. 14 is adapted to include 6 photodiodes in positions D1, D2, D3, D4, D5 and D6 matching the positions of the holes shown in surface 510. Accordingly, PCB 600 may be used to replace the section of imaging device 500 that includes surface 510. The photodetectors on the PCB may be routed to a driver board which includes the processing circuitry to read the photo detector's output signals to form the image of a target placed within imaging device 500.

Figure 15:
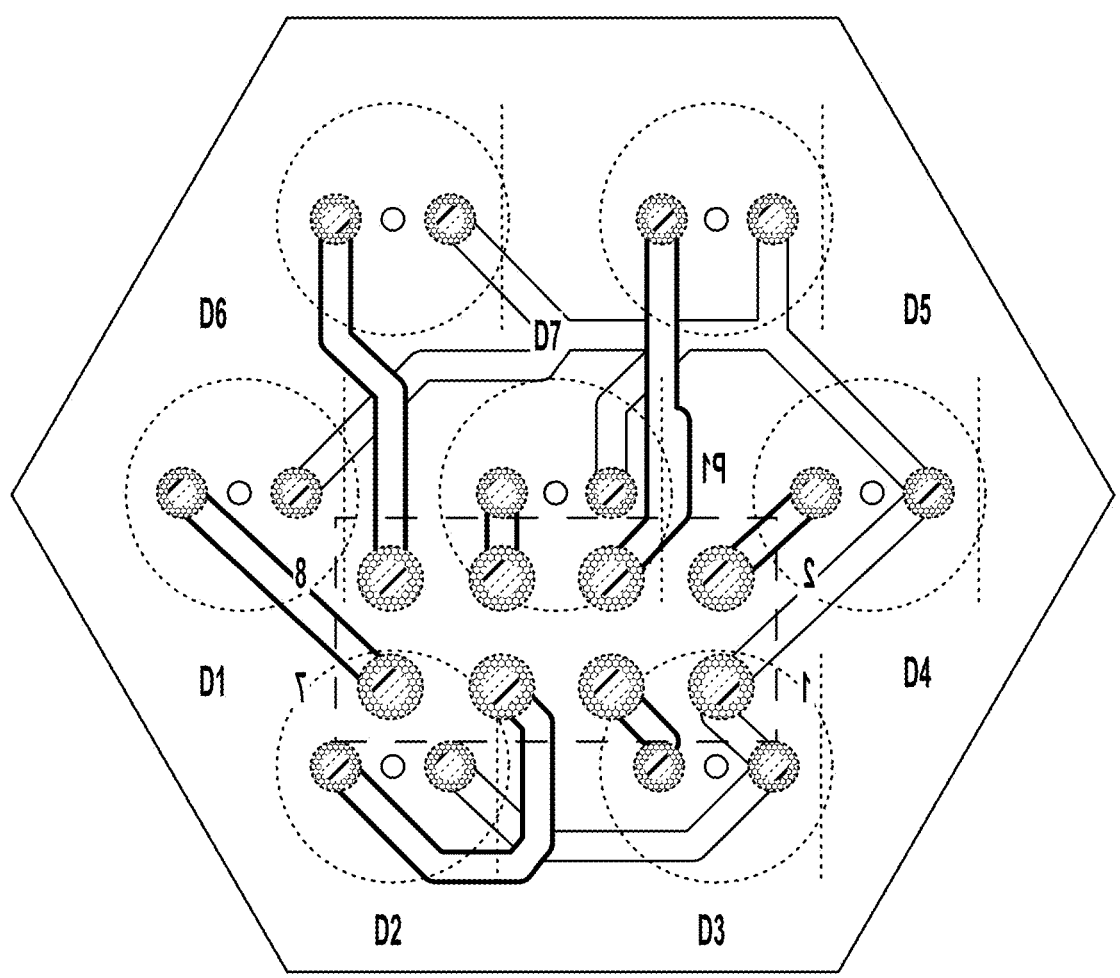
FIG. 15 shows a printed circuit board that includes, in part, a multitude of directional receiving elements and adapted to form the hexagonal surface of the icosahedron shown in FIG. 14, in accordance with one embodiment of the present invention.

Similarly, for example, PCB 700 shown in FIG. 15 is adapted to include 7 photodiodes in positions D1, D2, D3, D4, D5, D6 and D7 matching the positions of the holes shown in the surfaces abutting surface 510. Accordingly, PCB 700 may be used to replace each such abutting surface in imaging device 500. The photodetectors on the PCB may be routed to a driver board which includes the processing circuitry configured to read the photo detector's output signals to form the image of a target placed within imaging device 500.

The above embodiments of the present invention are illustrative and not limitative. The embodiments of the present invention are not limited by the number of receiving elements or pixels in the array or the number of array dimensions. The above embodiments of the present invention are not limited by the wavelength or frequency of the light. Other modifications and variations will be apparent to those skilled in the art and are intended to fall within the scope of the appended claims.

What is claimed is:

1. A lens-less 3-D imaging device comprising:
   a plurality of optical receiving elements positioned along a surface defining a focal zone in which a 3-D image of a target is formed, each of the plurality of optical receiving elements being responsive to light received from a different direction when positioned at a same location, each of the plurality of optical receiving elements having a field of view that overlaps with a field of view of at least a subset of a remaining ones of the plurality of optical receiving elements, wherein at least a first subset of the plurality of optical receiving elements has a Gaussian distribution response.

2. The lens-less 3-D imaging device of claim 1 wherein each of the plurality of optical receiving elements is a transparent dielectric element.

3. The lens-less 3-D imaging device of claim 2 wherein each of the plurality of grating couplers has a same angular view.

4. The lens-less 3-D imaging device of claim 1 wherein each of the plurality of optical receiving elements is a grating coupler.

5. The lens-less 3-D imaging device of claim 1 wherein each of the plurality of optical receiving elements is a photo detector.

6. The lens-less 3-D imaging device of claim 5 wherein each of the plurality of photo detectors has a same angular view.

7. The lens-less 3-D imaging device of claim 1 wherein at least a first subset of the plurality of optical receiving elements has a non-Gaussian distribution response.

8. The lens-less 3-D imaging device of claim 1 wherein the plurality of optical receiving elements are positioned along inner surfaces of an icosahedron.

9. The lens-less 3-D imaging device of claim 8 wherein each of at least a subset of the inner surfaces of the icosahedron comprises a circuit board on which at least a subset of the plurality of receiving elements are disposed.

10. The lens-less 3-D imaging device of claim 9 wherein at least one of the circuit boards comprises control circuitry configured to form the 3-D image in accordance with received responses of the optical receiving elements and further in accordance with optical transfer functions of the of optical receiving elements.

11. The lens-less 3-D imaging device of claim 1 wherein said surface comprises at least one flexible circuit board.

12. The lens-less 3-D imaging device of claim 11 wherein the flexible circuit board comprises one or more flex sensors adapted to determine a curvature of the flexible circuit board.

13. The lens-less 3-D imaging device of claim 11 wherein the flexible circuit board comprises one or more strain gauges adapted to determine a curvature of the flexible circuit board.

14. The lens-less 3-D imaging device of claim 1 wherein said plurality of optical receiving elements are formed in one or more substrates comprising an illumination source.

15. The lens-less 3-D imaging device of claim 1 wherein each optical receiving element is a plasmonic antenna.

16. A method of forming a 3-D image of a target, the method comprising:
receiving a response from each of a plurality of optical receiving elements positioned along a surface, each of the plurality of optical receiving elements being responsive to light received from a different direction when positioned at a same location, each of the plurality of optical receiving elements having a field of view that overlaps with a field of view of at least a subset of a remaining ones of the plurality of optical receiving elements; and
forming the 3-D image in accordance with the received responses and further in accordance with optical transfer functions of the plurality of optical receiving elements, wherein at least a first subset of the plurality of optical receiving element has a Gaussian distribution response.

17. The method of claim 16 wherein each of the plurality of optical receiving elements is a transparent dielectric element.

18. The method of claim 16 each of the plurality of optical receiving elements is a grating coupler.

19. The method of claim 18 wherein each of the plurality of grating couplers has a same angular view.

20. The method of claim 16 wherein each of the plurality of optical receiving elements is a photo detector.

21. The method of claim 16 wherein each of the plurality of photo detectors has a same angular view.

22. The method of claim 16 wherein the plurality of optical receiving elements are positioned along inner surfaces of an icosahedron.

23. The method of claim 22 wherein each of at least a subset of the inner surfaces of the icosahedron comprises a circuit board on which the plurality of receiving elements are disposed.

24. The method of claim 23 wherein at least one of the circuit boards comprises control circuitry configured to form the 3-D image in accordance with received responses of the optical receiving elements and further in accordance with optical transfer functions of the optical receiving elements.

25. The method of claim 16 wherein said surface comprises at least one flexible circuit board.

26. The method of claim 25 wherein the flexible circuit board comprises one or more flex sensors adapted to determine a curvature of the flexible circuit board.

27. The method of claim 25 wherein the flexible circuit board comprises one or more strain gauges adapted to determine a curvature of the flexible circuit board.

28. The method of claim 16 wherein said plurality of optical receiving elements are formed in one or more substrates comprising an illumination source.

29. The method of claim 16 wherein each optical receiving element is a plasmonic antenna.

\* \* \* \* \*